US008812767B2

(12) United States Patent
Sawa

(10) Patent No.: US 8,812,767 B2
(45) Date of Patent: Aug. 19, 2014

(54) METHOD OF CONTROLLING MEMORY, MEMORY CONTROL CIRCUIT, STORAGE DEVICE AND ELECTRONIC DEVICE

(75) Inventor: Kazuya Sawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 242 days.

(21) Appl. No.: 13/352,436

(22) Filed: Jan. 18, 2012

(65) Prior Publication Data

US 2012/0233379 A1    Sep. 13, 2012

(30) Foreign Application Priority Data

Mar. 8, 2011    (JP) ................. 2011-050372

(51) Int. Cl.
*G06F 12/00* (2006.01)
*G06F 13/00* (2006.01)
*G11C 16/10* (2006.01)
*G06F 12/02* (2006.01)

(52) U.S. Cl.
CPC ............ *G06F 12/00* (2013.01); *G06F 13/00* (2013.01); *G11C 16/10* (2013.01); *G06F 2212/7201* (2013.01); *G06F 12/0246* (2013.01)
USPC .......... 711/102; 711/100; 711/133; 711/154; 711/159; 711/E12.001

(58) Field of Classification Search
USPC .......... 711/100, 102, 133, 154, 159, E12.001
See application file for complete search history.

(56) References Cited

U.S. PATENT DOCUMENTS

| 5,740,396 A | 4/1998 | Mason |
| 5,742,934 A | 4/1998 | Shinohara |
| 5,822,781 A | 10/1998 | Wells et al. |
| 6,513,095 B1 | 1/2003 | Tomori |
| 2009/0287890 A1* | 11/2009 | Bolosky ................. 711/155 |
| 2010/0332717 A1 | 12/2010 | Maeda et al. |
| 2011/0087950 A1* | 4/2011 | Yu et al. ................. 714/773 |

FOREIGN PATENT DOCUMENTS

| JP | 06-202821 A | 7/1994 |
| JP | 08-221223 A | 8/1996 |
| JP | 09-081332 A | 3/1997 |
| JP | 09-097217 A | 4/1997 |
| JP | 2001-051889 A | 2/2001 |
| JP | 2003-203016 A | 7/2003 |
| JP | 2003-228513 A | 8/2003 |
| JP | 2003-316659 A | 11/2003 |
| JP | 2005-242897 A | 9/2005 |
| JP | 2005-339450 | 12/2005 |
| JP | 2009-116465 A | 5/2009 |
| JP | 2009-116661 | 5/2009 |

* cited by examiner

*Primary Examiner* — Midys Rojas
(74) *Attorney, Agent, or Firm* — Fujitsu Patent Center

(57) ABSTRACT

A method of controlling a memory including a first storage area and a second storage area. The method includes determining, in response to a request for writing a write data string, whether the write data string changes a logical value stored in the memory from a first logical value to a second logical value, writing, to the first storage area, a logical value that is located in a position of the write data string and does not change an existing logical value of the memory from the first logical value to the second logical value, and writing the second logical value that is located in a position of the write data string and changes an existing logical value of the memory from the first logical value to the second logical value to the second storage area which is different from the first storage area.

10 Claims, 9 Drawing Sheets

Fig.8
23a
[000] 0 0 0 0 1 1 1 1
[001] 0 0 0 0 1 1 1 1
[002] 0 0 0 0 1 1 1 1
23c
[000] 1 1 1 1 1 1 1 1
[001] 1 1 1 1 1 1 1 1
[002] 1 1 1 1 1 1 1 1
Fig.9
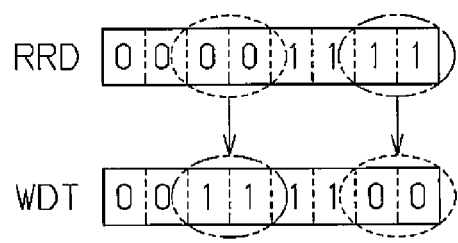
Fig.10
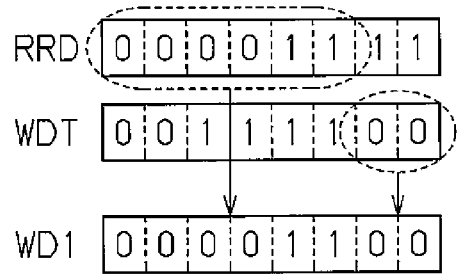 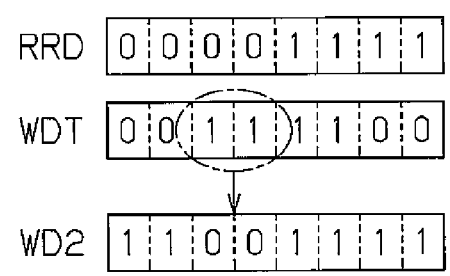

US 8,812,767 B2

METHOD OF CONTROLLING MEMORY, MEMORY CONTROL CIRCUIT, STORAGE DEVICE AND ELECTRONIC DEVICE

CROSS-REFERENCE TO RELATED APPLICATIONS

This application is based upon and claims the benefit of priority from prior Japanese Patent Application No. 2011-50372, filed on Mar. 8, 2011, the entire contents of which are incorporated herein by reference.

FIELD

The embodiments relate to a method for controlling a memory, a memory control circuit, a storage device and an electronic device.

BACKGROUND

Conventionally, an electronic device such as a personal computer includes a storage device, such as a nonvolatile semiconductor memory. Examples of the nonvolatile semiconductor memory include a flash memory capable of electrically rewriting stored content.

Referring to the nonvolatile semiconductor memory such as flash memory, the number of operations for rewriting stored content to each memory cell has an upper limit. In the case of rewriting operations for which the quantity exceeds the upper limit and are carried out for a single memory cell of the nonvolatile semiconductor memory, data written to the memory cell is not guaranteed to be held. Accordingly, restrictions for the number of rewrite operations for a memory cell correspond to the period for which the semiconductor memory may be used, that is, the life of the device.

Conventional methods for prolonging the life of a semiconductor memory are described in Japanese Laid-Open Patent Publications Nos. 2005-242897, 2003-228513 and 2009-116465, for example.

In the case in which logic 0 data stored in a memory cell of a flash memory is rewritten to logic 1 data, there are restrictions in that an erasing operation is also carried out over a whole sector including the rewritten-target memory cell. For this reason, a reduction in the number of erasing operations is desired.

SUMMARY

One aspect of the embodiments is a method of controlling a memory including a first storage area and a second storage area. The method includes determining, in response to a request for writing a write data string, whether the write data string changes a logical value stored in the memory from a first logical value to a second logical value, writing, to the first storage area, a logical value that is located in a position of the write data string and does not change an existing logical value of the memory from the first logical value to the second logical value, and writing the second logical value that is located in a position of the write data string and changes an existing logical value of the memory from the first logical value to the second logical value to the second storage area which is different from the first storage area.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which:

FIG. 6 is a flow chart illustrating a transfer processing;

FIGS. 7 to 11 are diagrams for explaining a write processing;

DESCRIPTION OF THE EMBODIMENTS

An embodiment will be described below with reference to FIGS. 1 to 12.

Figure 1:
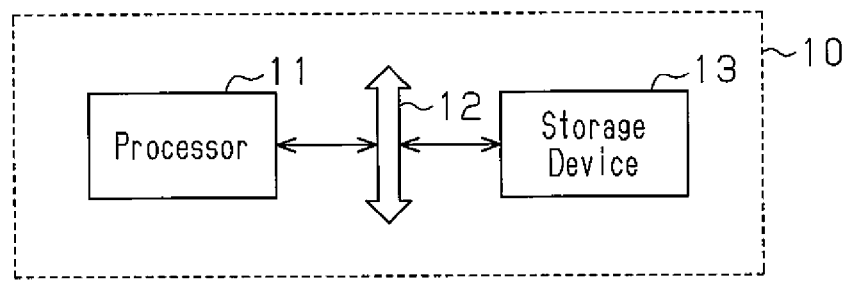
FIG. 1 is a schematic diagram illustrating an electronic device including a storage device.

As illustrated in FIG. 1, an electronic device 10 includes a processor (for example, a CPU) 11, and a storage device 13 coupled to the processor 11 via a bus 12. The electronic device 10 is a personal computer, for example.

The storage device 13 includes a nonvolatile semiconductor memory (for example, a flash memory) and stores program data files or various data files. The processor 11 reads data stored in the storage device 13 through the bus 12 and executes a processing in accordance with the data. The processor 11 stores a data file created in accordance with the processing to be executed in the storage device 13 through the bus 12.

Next, a schematic structure of the storage device 13 will be described.

Figure 2:
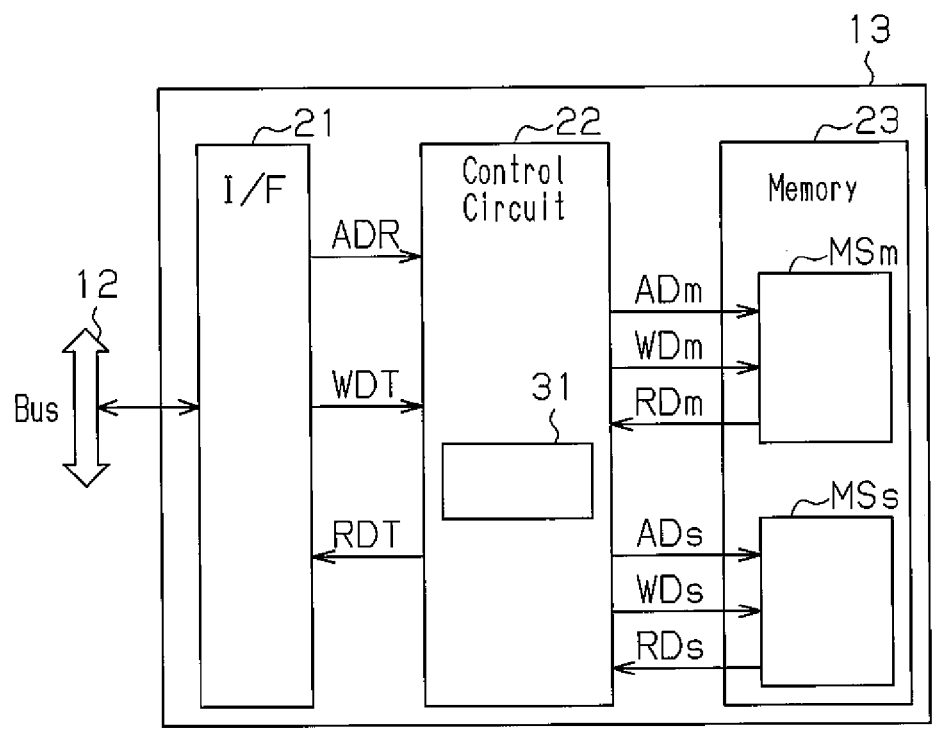
FIG. 2 is a block diagram illustrating the storage device.

As illustrated in FIG. 2, the storage device 13 includes an interface circuit (referred to as an I/F) 21, a control circuit 22 and a memory 23.

The interface circuit 21 transmits and receives various signals to and from the processor 11 through the bus 12. For example, the processor 11 provides the storage device 13 with command information for writing or reading a data string, address information for specifying a data string to be written or read, and a write data string WDT to be written to the storage device 13. The data string includes a plurality of bits (for example, eight). The interface circuit 21 provides the control circuit 22 with the information received through the bus 12. The control circuit 22 writes the data string WDT to the memory 23 in accordance with the information provided from the processor 11. Moreover, the control circuit 22 sends a read data string RDT read from the memory 23 to the bus 12 through the interface circuit 21 in accordance with the information transferred from the processor 11. The processor 11 receives the read data string RDT through the bus 12.

The memory 23 is a nonvolatile semiconductor memory, for example, a flash memory. Each of the memory cells included in the memory 23 stores a logical value of 0 or a logical value of 1. A change in the logical value of the memory cell from 0 to 1 may be referred to as an erasure (or "0 to 1 rewriting"). A change in the logical value from 1 to 0 may be referred to as writing (or "logical 0 rewriting"). Accordingly, each memory cell included in the memory 23 has the logical value of 1 in the erasure state and has the logical value of 0 in the write state.

Each memory cell is changeable from the erasure state to the write state independently of the other memory cells. However, it is impossible to erase a single memory cell in a sector while maintaining the other memory cells in the same sector including the single memory cell in the write state. In order to change a memory cell in a single sector into the erasure state, accordingly, all of the memory cells included in the single sector are simultaneously changed from the write state into the erasure state.

The memory 23 includes a plurality of sectors including a first sector MSm and a second sector MSs. A sector is a unit area to be an erasing target when the stored data are to be erased, for example.

The first sector MSm includes memory cells the number of which corresponds to address information (hereinafter referred to as an external address ADR) provided from the processor 11 in access from the processor 11 and a data volume (a bit number) of a write or read data string to be accessed by the processor 11, that is, a memory capacity depending on the external address ADR. For example, the external address ADR may have 32 bits and a single data string may have eight bits.

The second sector MSs has a memory capacity set depending on the memory capacity of the first sector MSm (for example, a half of the memory capacity of the first sector MSm). Address information of each of the sectors MSm and MSs is set to be selectively accessible to each address. The address information of each of the sectors MSm and MSs may be referred to as an internal address. The first sector MSm is an example of a first storage area and may be referred to as a main sector. The second sector MSs is an example of a second storage area and may be referred to as an auxiliary sector.

As described above, the processor 11 outputs the external address ADR to write and/or read a data string. An address translator 31 of the control circuit 22 has a conversion table which will be described below. The conversion table may be stored in a static random access memory (SRAM), for example.

The address translator 31 converts the external address ADR into an internal address ADm for accessing the main sector MSm. The address translator 31 converts the external address ADR into an internal address ADs for accessing the auxiliary sector MSs.

The control circuit 22 generates a write data string WDm to be written to the main sector MSm and a write data string WDs to be written to the auxiliary sector MSs based on the write data string WDT provided through the interface circuit 21 from the processor 11 illustrated in FIG. 1. The control circuit 22 generates the read data string RDT based on a read data string RDm read from the main sector MSm and a read data string RDs read from the auxiliary sector MSs.

The control circuit 22 controls writing a data string to and reading a data string from the main sector MSm and the auxiliary sector MSs in accordance with the information stored in the table of the address translator 31. The conversion table of the address translator 31 includes address converting information for converting the external address ADR into the internal addresses ADm and ADs. The conversion table of the address translator 31 includes status information indicating whether auxiliary data corresponding to a data string stored in the main sector MSm is stored in the auxiliary sector MSs.

Writing the data string to the memory 23 will be described below.

As described above, when one of the memory cells in the memory 23 is changed from the write state to the erasure state, it is necessary to erase the whole sector including the memory cell in a lump. Therefore, the control circuit 22 determines whether the write data string WDT includes data that changes the state of the memory cell from the write state to the erasure state (which data may be referred to as "0-to-1 changing data"). For example, the control circuit 22 compares the read data string RDT read from the memory 23 in accordance with the external address ADR with the write data string WDT on a bit unit before writing the write data string WDT to determine whether the 0-to-1 changing data is included in the write data string WDT.

If the 0-to-1 changing data is not included in the write data string WDT, the control circuit 22 writes the write data string WDT to the main sector MSm. Accordingly, the control circuit 22 outputs the write data string WDm which is identical to the write data string WDT, and converts the external address ADR into the internal address ADm for accessing the main sector MSm and then provides the internal address ADm and the write data string WDm to the memory 23. The memory 23 stores the write data string WDm in the main sector MSm based on the internal address ADm.

If the 0-to-1 changing data is included in the write data string WDT, the control circuit 22 generates the write data string WDm to be written to the main sector MSm and the write data string WDs to be written to the auxiliary sector MSs from the write data string WDT. For example, the control circuit 22 changes the 0-to-1 changing data in the write data string WDT into the logical value of 0 and thus generates the write data string WDm. Accordingly, the 0-to-1 changing data is not included in the write data string WDm. The control circuit 22 stores the write data string WDm in the internal address ADm into which the external address ADR is converted by the address translator 31.

The control circuit 22 generates data configured to logically invert only a bit in a position of the 0-to-1 changing data (a bit position). For example, the control circuit 22 generates the auxiliary data string WDs in which each of the bits in the positions of the 0-to-1 changing data in the write data string WDT is set to the logical value of 0-to-1 changing and each of the remaining bits other than the positions of the 0-to-1 changing data is set to the logical value of 1. The control circuit 22 assigns the auxiliary sector MSs to a certain area of the main sector MSm depending on the internal address ADm and holds the assignment information of the auxiliary sector MSs. The control circuit 22 stores, in the table of the address translator 31, address converting information for converting the external address ADR into the internal address ADs for writing the auxiliary data string WDs to the auxiliary sector MSs. Furthermore, the control circuit 22 associates status information indicating that the auxiliary data string WDs corresponding to the write data string WDm is present with address converting information for converting the external address ADR into the internal address ADm and stores the information in the table of the address translator 31.

Thus, the control circuit 22 stores, in the main sector MSm, the write data string WDm including no 0-to-1 changing data. When writing the write data string WDT including the 0-to-1 changing data to the storage device 13, therefore, no erasing operation is carried out for the main sector MSm. The auxiliary data string WDs includes the logical value of 0 in the position of the 0-to-1 changing data. The logical value of 0 serves to change the memory cell into the write state. When writing the auxiliary data string WDs, therefore, no erasing operation is carried out for the auxiliary sector MSs.

Also in the case in which the write data string WDT includes the 0-to-1 changing data, thus, writing the data string WDT to the memory 23 is not accompanied by the erasing operation. As compared with a time required for writing the data string accompanying the erasing operation, therefore, a time required for writing the write data string WDT may be shortened. Moreover, writing the write data string WDT including the 0-to-1 changing data is not accompanied by the erasing operation. For this reason, the number of the erasing operations of the memory 23 is reduced as compared with the related art. This prolongs a period for which the memory 23 is operable, that is, the life of the memory 23.

Next, reading the data string will be described.

The control circuit 22 receives the external address ADR. The address translator 31 converts the external address ADR into the internal address ADm. The control circuit 22 reads the data string RDm from the main sector MSm of the memory 23 in accordance with the internal address ADm. The control circuit 22 determines whether an auxiliary data string corresponding to the internal address ADm is present in accordance with status information corresponding to the internal address ADm. If the auxiliary data string is not present, the control circuit 22 outputs the read data string RDT which is identical to the data string RDm read from the main sector MSm.

In the case in which the auxiliary data string corresponding to the internal address ADm is present, the address translator 31 of the control circuit 22 converts the external address ADR into the internal address ADs in accordance with the assignment information of the auxiliary sector MSs. The control circuit 22 reads the auxiliary data string RDs from the auxiliary sector MSs of the memory 23 in accordance with the internal address ADs. The control circuit 22 combines the data string RDm read from the main sector MSm with the auxiliary data string RDs read from the auxiliary sector MSs to generate the read data string RDT.

The auxiliary data string RDs indicates the position of the 0-to-1 changing data for the data string RDm read from the main sector MSm. For example, the logical value of 0 in the auxiliary data string RDs indicates the position of the 0-to-1 changing data in bits of the data string RDm, and the logical value of 1 in the auxiliary data string RDs indicates a bit position other than the 0-to-1 changing data in the bits of the data string RDm. The control circuit 22 combines the auxiliary data string RDs with the data string RDm to generate the read data string RDT including the 0 to 1 converting data. For example, the control circuit 22 logically inverts each bit of the auxiliary data string RDs to generate an inverted data string, and combines the inverted data string with the data string RDm read from the main sector MSm, for example, executes an OR processing. The read data string RDT subjected to the combining processing has a bit with the logical value of 1 in the bit position of the 0-to-1 changing data in the data string RDm read from the main sector MSm. Accordingly, the control circuit 22 generates a data string including the bit having the logical value of 1 in the bit position of the 0-to-1 changing data from the data string RDm read from the main sector MSm based on the auxiliary data string RDs.

Next, an operation for a memory having a plurality of main sectors will be described with reference to FIGS. 3(a) to 3(e). FIGS. 3(a) to 3(e) illustrate only the address translator 31 included in the control circuit 22 and the memory 23.

Figure 3A:
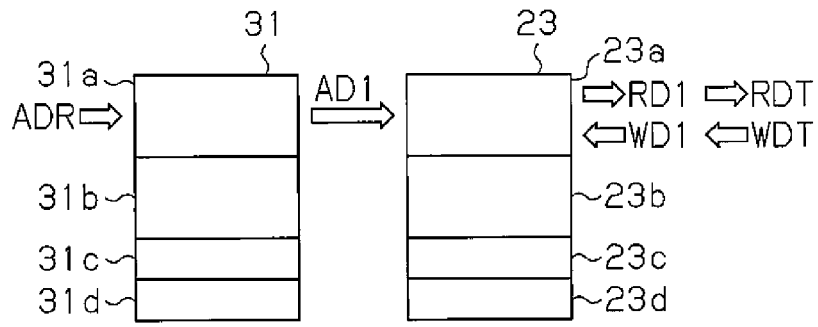
FIGS. 3(a) to 3(e) are diagrams for explaining an operation of the storage device.

As illustrated in FIG. 3(a), the memory 23 has two main sectors 23a and 23b, and two auxiliary sectors 23c and 23d.

The address translator 31 has main tables 31a and 31b corresponding to the main sectors 23a and 23b respectively, and auxiliary tables 31c and 31d corresponding to the auxiliary sectors 23c and 23d respectively.

Each of the main sectors 23a and 23b has the external address ADR provided from the processor 11 in access from the processor 11, and memory cells the number of which corresponds to a data volume (a bit number) of the write or read data string accessed by the processor 11. The auxiliary sectors 23c and 23d indicate storage areas for a memory capacity set depending on the memory capacities of the main sectors 23a and 23b (for example, a half of the memory capacities of the main sectors 23a and 23b).

The control circuit 22 selects one of the two main sectors 23a and 23b as a target sector and selects the other as a non-target sector. The control circuit 22 alternately switches the target sector and the non-target sector. The control circuit 22 accesses the target sector in response to the external address ADR. The control circuit 22 brings a memory cell of the non-target sector into the erasure state. In an example, the main sector 23a is the target sector and the main sector 23b is the non-target sector.

The control circuit 22 converts the external address ADR into an internal address AD1 for accessing the main sector 23a by referring to the main table 31a. The control circuit 22 determines whether an auxiliary data string is present based on the status information related to the address converting information corresponding to the internal address AD1. If the auxiliary data string is not present, the control circuit 22 accesses the main sector 23a in accordance with the internal address AD1 and outputs the read data string RDT which is identical to the read data string RD1 read from the main sector 23a as illustrated in FIG. 3(a).

The control circuit 22 determines whether the 0-to-1 changing data are included in the write data string WDT. If the 0-to-1 changing data is not included, the control circuit 22 stores the write data string WD1 which is identical to the write data string WDT in the main sector 23a in accordance with the internal address AD1 as illustrated in FIG. 3(a).

Figure 3B:
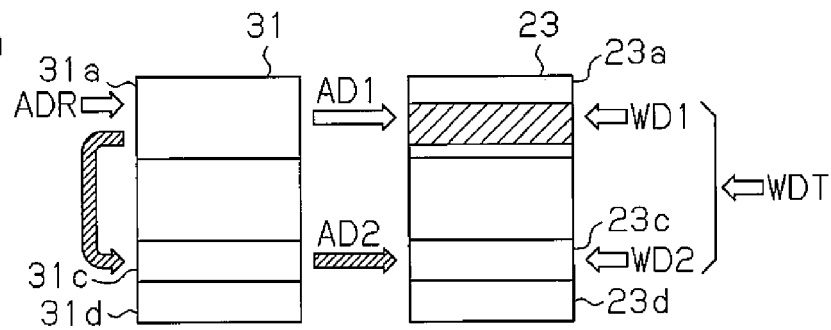

If the 0-to-1 changing data is included, the control circuit 22 assigns the auxiliary sector 23c to the target area of the main sector 23a in accordance with the external address ADR as illustrated in FIG. 3(b). The target area is set to include the storage area of the main sector 23a indicated as the internal address AD1 obtained by converting the external address ADR in accordance with the main table 31a. The auxiliary sector 23c is assigned to a portion illustrated in hatching in the main sector 23a of FIG. 3(b).

The control circuit 22 generates a write data string WD1 including no 0-to-1 changing data from the write data string WDT. The control circuit 22 generates an auxiliary data string WD2 having a bit with the logical value of 0 which is to be written to the memory cell in the position of 0-to-1 changing data in the write data string WDT. The control circuit 22 converts the external address ADR into the internal address AD1 in accordance with the main table 31a. Then, the control circuit 22 stores the write data string WD1 in the main sector 23a in accordance with the internal address AD1.

The control circuit 22 relates the status information indicative of the presence of the auxiliary data string WD2 to the address converting information for the internal address AD1 and stores the information in the main table 31a. The control circuit 22 stores, in the auxiliary table 31c, the address converting information for generating an internal address to access the auxiliary sector 23c based on the assignment information of the auxiliary sector 23c and the internal address AD1. The control circuit 22 converts the external address ADR into the internal address AD2 in accordance with the auxiliary table 31c. Then, the control circuit 22 stores an auxiliary data string WD2 in the auxiliary sector 23c in accordance with the internal address AD2.

Figure 3C:
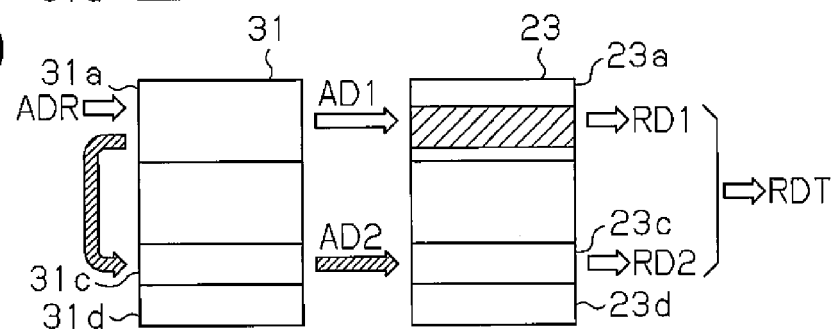

In a reading operation, as illustrated in FIG. 3(c), the control circuit 22 converts the external address ADR into the internal address AD1 for accessing the main sector 23a by referring to the main table 31a. The control circuit 22 reads the read data string RD1 from the main sector 23a in accordance with the internal address AD1 and holds the read data string RD1 thus read.

Subsequently, the control circuit 22 determines whether an auxiliary data string is present based on the status information related to the address converting information corresponding to the internal address AD1. If the auxiliary data string is present, the control circuit 22 converts the external address ADR into the internal address AD2 in accordance with the auxiliary table 31c. The control circuit 22 reads an auxiliary data string RD2 from the auxiliary sector 23c in accordance with the internal address AD2. Then, the control circuit 22 combines the auxiliary data string RD2 thus read with the held read data string RD1 to generate the read data string RDT.

Figure 3D:
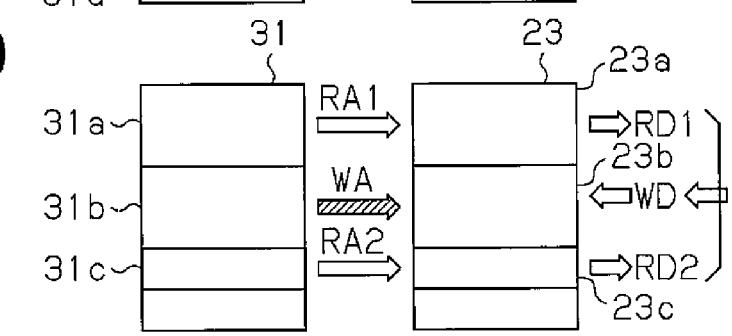

The control circuit 22 executes a transfer processing in a certain timing which is controlled. The certain timing implies a time that a transfer command is provided from an outside (for example, the processor 11), for instance. The control circuit 22 starts a transfer processing as illustrated in FIG. 3(d) in response to the transfer command. Accordingly, the control circuit 22 sequentially generates a read address RA1 in accordance with the main table 31a, and sequentially reads the data string RD1 from the main sector 23a in accordance with the read address RA1. If status information corresponding to access information of the read address RA1 indicates no auxiliary data, the control circuit 22 stores the write data string WD which is identical to the data string RD1 corresponding to the read address RA1 in the main sector 23b in accordance with a write address WA generated in accordance with the main table 31b.

On the other hand, if the status information corresponding to the access information of the read address RA1 indicates that the auxiliary data is present, the control circuit 22 generates a read address RA2 in accordance with the read address RA1 and the auxiliary table 31c and reads the data string RD2 from the auxiliary sector 23c in accordance with the read address RA2. In the same manner as in FIG. 3(c), then, the control circuit 22 combines the data string RD1 read from the main sector 23a with the data string RD2 read from the auxiliary sector 23c to generate the write data string WD and to store the write data string WD in the main sector 23b in conformity to the write address WA generated in accordance with the main table 31b.

Accordingly, the control circuit 22 transfers the data string of the main sector 23a and the data string of the auxiliary sector 23c to the main sector 23b. When all of the data in the main sector 23a and the auxiliary sector 23c are ended to be transferred, the control circuit 22 sets the main sector 23b to be a transfer destination to an access target sector and sets the main sector 23a to be a transfer source to a non-target sector. Furthermore, the control circuit 22 classifies the main table 31a corresponding to the main sector 23a and the auxiliary table 31c corresponding to the auxiliary sector 23c into dirty sectors.

During the transfer processing, the control circuit 22 permits write and/or read accesses to the memory 23. The sectors to be writing and reading targets are determined depending on a result of the comparison between the external address ADR and the write address WA. For example, in the case in which the external address ADR is smaller than the write address WA, the data string corresponding to the external address ADR has already been transferred from the main sector 23a to the main sector 23b. Accordingly, an access target based on the external address ADR is the main sector 23b to be the transfer destination. On the other hand, in the case in which the external address ADR is larger than the write address WA, the data string corresponding to the external address ADR is still present in the main sector 23a. Therefore, the access target based on the external address ADR has the main sector 23a to be the transfer source and the auxiliary sector 23c (in the case in which the 0-to-1 changing data is present).

Figure 3E:
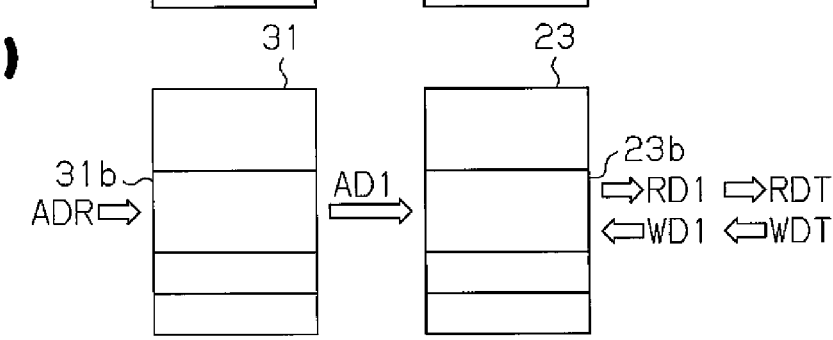

When the transfer processing is ended as described above, the control circuit 22 converts the external address ADR into the internal address AD1 by referring to the main table 31b and carries out read/write from/to the main sector 23b in accordance with the internal address AD1 as illustrated in FIG. 3(e). Moreover, the control circuit 22 erases all of the data in the main sector 23a and the auxiliary sector 23c which are classified into the dirty sectors. If it is determined that the 0-to-1 changing data is present in the write data string WDT to the main sector 23b, the control circuit 22 assigns the auxiliary sector 23d to the main sector 23b and writes the data strings WD1 and WD2 to the main sector 23b and the auxiliary sector 23d in the same manner as in FIG. 3(b).

As described above, the control circuit 22 sets one of the main sectors 23a and 23b as the target sector and sets the other as the non-target sector. The control circuit 22 accesses the target sector in response to the external address ADR. The control circuit 22 erases all of the memory cells of the non-target sector. The control circuit 22 executes the erasing operation for the non-target sector for a period in which the target sector may be accessed. Accordingly, the processor 11 illustrated in FIG. 1 does not need to wait for the completion of the erasing operation for the main sector but may continuously access the storage device 13.

The control circuit 22 alternately switches the target sector and the non-target sector for the main sectors 23a and 23b. Accordingly, the control circuit 22 alternately executes the erasing operation for the two main sectors 23a and 23b. Consequently, the number of the erasing operations for the main sectors 23a and 23b is smaller than that in the case in which the writing operation and the erasing operation are executed for a single sector. Thus, a period for which the memory 23 is operable, that is, the life of the memory 23 may be prolonged.

Next, an example of the control circuit 22 will be described.

Figure 4:
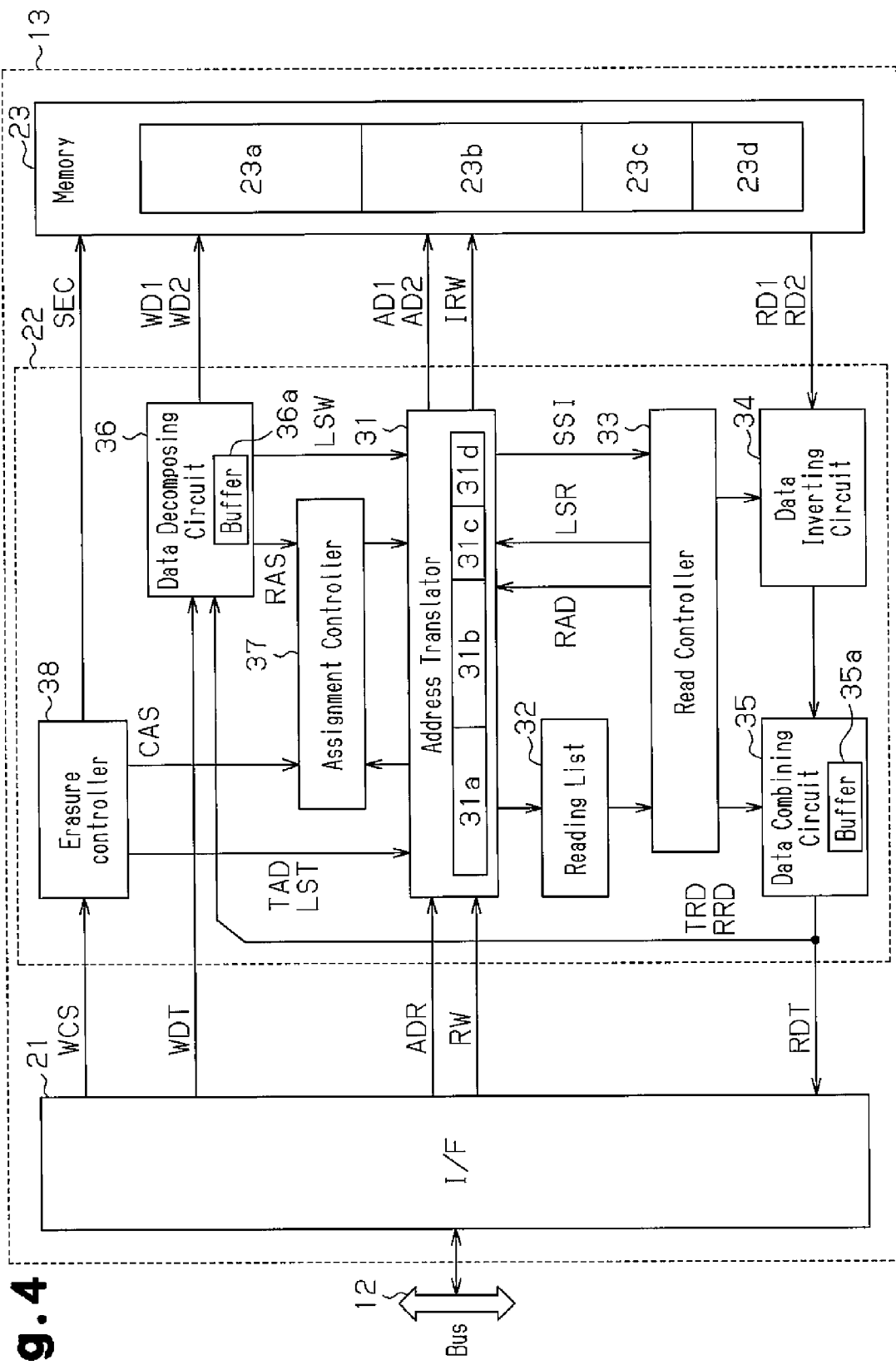
FIG. 4 is a block diagram illustrating the storage device.

As illustrated in FIG. 4, the external address ADR and an external access signal RW are provided to the address translator 31 of the control circuit 22 through the interface circuit 21. The external access signal RW indicates whether access to the storage device 13 is read access or write access. For example, the external access signal RW having an H level indicates the read access and the external access signal RW having an L level indicates the write access.

The address translator 31 has a plurality of conversion tables 31a to 31d. Each of the conversion tables 31a to 31d may be stored in an SRAM, for example. The first conversion table 31a and the second conversion table 31b are illustrative as a main table, and the third conversion table 31c and the fourth conversion table 31d are illustrative as an auxiliary table.

The first conversion table 31a stores the address converting information for converting the external address ADR into the internal address AD1 and the sector status information indicating whether the auxiliary data string corresponding to the data string stored in the area (memory cell) indicated by the internal address AD1 is present. Similarly, the second conversion table 31*b* stores the address converting information for converting the external address ADR into the internal address AD1 and the sector status information indicating whether the auxiliary data string corresponding to the data string stored in the area (memory cell) indicated by the internal address AD1 is present. The third conversion table 31*c* stores address converting information for converting a read address RAD into the internal address AD2. Similarly, the fourth conversion table 31*d* stores address converting information for converting the read address RAD into the internal address AD2. The read address RAD is provided from a read controller 33.

The address translator 31 outputs the internal address and the internal access information based on the external access signal RW indicative of the read access or the write access.

In the case in which the external access signal RW indicates the read access, the address translator 31 converts the external address ADR into the internal address AD1 by referring to the main tables 31*a* and 31*b*, and provides an internal access signal IRW indicating the read access and the internal address AD1 to the memory 23. In the case in which the auxiliary data string corresponding to the data string indicated by the external address ADR is present, the address translator 31 converts the read address RAD provided from the read controller 33 into the internal address AD2 by referring to the auxiliary tables 31*c* and 31*d*, and provides the internal access signal IRW indicative of the read access and the internal address AD2 to the memory 23.

In the case in which the external access signal RW indicates the write access, the address translator 31 provides the internal access signal IRW indicative of the read access and the internal address AD1 (the internal address AD2 if necessary) to the memory 23 in the same manner as the case of the read access. Based on a table specifying signal LSW provided from a data decomposing circuit 36, then, the address translator 31 converts the external address ADR into the internal address AD1 by referring to the main tables 31*a* and 31*b* and provides the internal access signal IRW indicative of the write access and the internal address AD1 to the memory 23. In the case in which the auxiliary data string is present, the address translator 31 converts the external address ADR into the internal address AD2 by referring to the auxiliary tables 31*c* and 31*d* and provides the internal access signal IRW indicative of the write access and the internal address AD2 to the memory 23 based on the table specifying signal LSW provided from the data decomposing circuit 36.

The address translator 31 stores hit information in a reading list 32 based on the sector status information stored in the main conversion tables 31*a* and 31*b* corresponding to the external address ADR. The sector status information indicates whether an auxiliary data string corresponding to a data string indicated by the external address ADR is present. The case in which the auxiliary data is present may be referred to as "hit". The address translator 31 stores the hit information in the reading list 32 in the case in which the auxiliary data is hit. The hit information includes the external address ADR and information (a table number) indicative of the conversion table for generating an internal address to access the sector storing the auxiliary data.

The address translator 31 provides sector status information SSI to the read controller 33.

The read controller 33 controls the read from a sector depending on the hit information stored in the reading list 32 in a subsequent cycle based on a clock signal when the auxiliary data is stored in the auxiliary sector depending on the sector status information SSI. For example, the read controller 33 provides the address translator 31 with the auxiliary read address RAD depending on the external address ADR read from the reading list 32. The read controller 33 provides the address translator 31 with a table specifying signal LSR depending on the table number read from the reading list 32.

The address translator 31 converts the auxiliary read address RAD into the internal address AD2 by referring to the auxiliary tables 31*c* and 31*d* depending on the table specifying signal LSR. The address translator 31 provides the memory 23 with the internal address AD2 and the internal access signal IRW for reading. The memory 23 reads a data string of the auxiliary sector indicated by the internal address AD2 and outputs the read data string RD2 in accordance with the internal access signal IRW.

The read controller 33 provides a control signal to a data inverting circuit 34 and a data combining circuit 35 in accordance with the sector status information SSI. The sector status information SSI indicates whether the auxiliary data is present. Accordingly, the read controller 33 outputs a control signal depending on whether the auxiliary data is present.

The data inverting circuit 34 outputs a data string which is identical to the data string RD1 read from the main sectors 23*a* and 23*b* in response to the control signal of the read controller 33, and logically inverts and outputs the data string RD2 read from the auxiliary sectors 23*c* and 23*d*.

If the auxiliary data string is not present, the data combining circuit 35 outputs the read data string RDT which is identical to the data string output from the data inverting circuit 34 in response to the control signal of the read controller 33. If the auxiliary data string is present, the data combining circuit 35 holds, in a buffer 35*a*, the data string provided from the data inverting circuit 34 in a first cycle in response to the control signal of the read controller 33, and outputs the read data string RDT obtained by combining the data string output from the data inverting circuit 34 with the data string held in the buffer 35*a* in subsequent cycles.

The data string provided from the data combining circuit 35 is utilized in the data decomposing circuit 36 in a write access (write processing) and transfer processing. In the write access, the data string provided from the data combining circuit 35 to the data decomposing circuit 36 may be referred to as a reference data string RRD in order to make a distinction from the read data string RDT output to the bus 12 through the interface circuit 21.

The write data string WDT is provided to the data decomposing circuit 36 through the interface circuit 21. The data decomposing circuit 36 compares the write data string WDT with the reference data string RRD every bit, and determines whether the 0-to-1 changing data is included in the write data string WDT. The data decomposing circuit 36 generates the write data strings WD1 and WD2 and provides the write data strings WD1 and WD2 to the memory 23 depending on a result of the decision for the 0-to-1 changing data.

The data decomposing circuit 36 provides an assignment necessity signal RAS to the assignment controller 37 depending on the result of the decision of the 0-to-1 changing data. For example, the data decomposing circuit 36 outputs the assignment necessity signal RAS having an H level which indicates an assignment necessity if the 0-to-1 changing data is included in the data string WDT, and outputs the assignment necessity signal RAS having an L level which indicates an assignment non-necessity if the 0-to-1 changing data is not included. If the assignment is required, the data decomposing circuit 36 outputs the table specifying signal LSW depending on the result of the decision.

Each of the conversion tables 31a to 31d of the address translator 31 is cleared in an initialized state (immediately after the transfer processing, for example). For this reason, the assignment controller 37 sets address converting information of the external address ADR and the internal address AD1 for accessing a target sector into the main table set as a target table. The assignment controller 37 sets status information (no auxiliary data string at this time) corresponding to the address converting information.

The address converting circuit 31 converts the external address ADR into the internal address AD1 in accordance with the address converting information set to the main tables 31a and 31b. The address converting circuit 31 provides the memory 23 with the internal address AD1 and the internal access signal IRW which is identical to the external access signal RW (indicative of the write access at this time). The memory 23 stores the write data string WD1 in an area indicated by the internal address AD1 in response to the internal access signal IRW.

The assignment controller 37 assigns the auxiliary table and sets the address converting information to the auxiliary table in response to the assignment necessity signal RAS having the H level which is output from the data decomposing circuit 36. The address converting circuit 31 converts the external address ADR into the internal address AD2 in accordance with the address converting information set to the auxiliary tables 31c and 31d. The address converting circuit 31 provides the memory 23 with the internal address AD2 and the internal access signal IRW for writing. The memory 23 stores the write data string WD2 in the auxiliary sector indicated by the internal address AD2 in accordance with the internal access signal IRW.

The assignment controller 37 assigns the auxiliary table and sets the address converting information to the auxiliary table in response to the hit information output from the address converting circuit 31. The address converting circuit 31 outputs the hit information when the sector status information of the internal address AD1 corresponding to the external address ADR has the auxiliary data. The auxiliary data (for example, data obtained through a logical inversion) are stored in the auxiliary sectors 23c and 23d when the 0-to-1 changing data is generated, that is, the data for changing the logical value of 0 to the logical value of 1 is included in the write data string WDT in the data string stored in the main sector. Consequently, the erasing operation for the whole main sectors 23a and 23b may be suppressed.

A writing operation that changes the logical value of 0 to the logical value of 1 may be carried out again in the same position (bit position) as described above with respect to the data string storing the auxiliary data in the auxiliary sectors 23c and 23d in some cases. For example, the state of the memory cell is changed like 1→0→1→0→1, that is, the write data string WDT including the 0-to-1 changing data is received twice or more. In the case in which a clear auxiliary sector is present for the writing, the assignment controller 37 assigns the clear auxiliary sector and writes data corresponding to the position of the 0-to-1 changing data to the auxiliary sector.

For example, the memory 23 illustrated in FIG. 4 has the two auxiliary sectors 23c and 23d. When access is given by setting a single auxiliary sector (for example, the sector 23) as a target sector, the auxiliary sector 23d is brought into a clear state. By assigning the auxiliary sector 23d, accordingly, the write data string WDT is stored as described above.

The erasure controller 38 executes the transfer processing in response to a write ending signal WCS provided from an outside through the interface circuit 21. The erasure controller 38 provides an assignment change signal CAS to the assignment controller 37, and the assignment controller 37 sets an unused sector to write the data string in response to the assignment changing signal CAS. The erasure controller 38 provides the address converting circuit 31 with an address signal TAD for a transfer and a table specifying signal LST for the transfer. The address converting circuit 31 changes the address signal TAD for the transfer to the internal addresses AD1 and AD2 by referring to the tables 31a to 31d, and provides the memory 23 with the internal access signal IRW and the internal addresses AD1 and AD2 which correspond to operations on different occasions.

Description will be given to the read, write and transfer operations of the control circuit 22.

[Read Operation]

1. The Case in which Auxiliary Sector has No Relevant Data

The external access signal RW indicative of the read access and the external address ADR are provided to the address converting circuit 31. The address converting circuit 31 converts the external address ADR into the internal address AD1 by referring to the target table (for example, the main table 31a) and provides the internal access signal IRW indicative of the read access and the internal address AD1 to the memory 23. The main table 31a is set by writing the data string, that is, the write operation.

The memory 23 reads the data string indicated by the internal address AD1 and outputs the read data string RD1. The read controller 33 controls the data inverting circuit 34 and the data combining circuit 35. The read data string RD1 output from the memory 23 is provided as the read data string RDT to the interface circuit 21 through the data inverting circuit 34 and the data combining circuit 35, and is output from the interface circuit 21 to the bus 12.

2. The Case in which Auxiliary Sector has Relevant Data

The external access signal RW indicative of the read access and the external address ADR are provided to the address converting circuit 31. The address converting circuit 31 converts the external address ADR into the internal address AD1 by referring to the main tables 31a and 31b, and provides the memory 23 with the internal access signal IRW indicative of the read access and the internal address AD1. The memory 23 reads the data string indicated by the internal address AD1 and outputs the read data string RD1. The read controller 33 controls the data inverting circuit 34 and the data combining circuit 35. The read data string RD1 output the memory 23 is provided to the data combining circuit 35 through the data inverting circuit 34, and the data combining circuit 35 holds the read data string in the buffer 35a.

The address converting circuit 31 outputs hit information and the reading list 32 stores the hit information. The read controller 33 reads the hit information stored in the reading list 32 and provides the read address RAD and the table specifying signal LSR to the address converting circuit 31 in a next cycle. The address converting circuit 31 changes the read address RAD to the internal address AD2 by referring to the auxiliary tables 31c and 31d. The address converting circuit 31 provides the memory 23 with the internal access signal IRW indicative of the read access and the internal address AD2. The memory 23 reads the data string indicated by the internal address AD1 and outputs the read data string RD2. The read controller 33 provides a control signal for an inverting operation to the data inverting circuit 34, and provides a control signal for a combining operation to the data combining circuit 35. The read data string RD1 output from the memory 23 is logically inverted through the data inverting circuit 34 and is provided to the data combining circuit 35.

The data combining circuit 35 combines the read data string provided from the data inverting circuit 34 with the read data string held in the buffer 35*a*, thereby generating and outputting the read data string RDT.

In the case in which a plurality of auxiliary sectors is set to the external address ADR, a plurality of hit information corresponding to the auxiliary sectors is stored in the reading list 32. The read controller 33 reads all of the hit information stored in the reading list 32, and carries out the same control as described above to combine a plurality of data strings read from the auxiliary sectors respectively with the data string held in the buffer 35*a*, thereby generating the read data string RDT.

[Write Operation]

1. First Write Operation

The external access signal RW indicative of the write access and the external address ADR are provided to the address converting circuit 31. The write data string WDT is provided to the data decomposing circuit 36. In a first write operation, the main tables 31*a* and 31*b* of the address converting circuit 31 are cleared. Therefore, the address converting information and the sector status information are set to the main table (for example, the main table 31*a*) to be a target through the assignment controller 37. The address converting circuit 31 converts the external address ADR into the internal address AD1 by referring to the main table 31*a*. The address converting circuit 31 provides the memory 23 with the internal access signal IRW indicative of the write access and the internal address AD1. The data decomposing circuit 36 provides the memory 23 with the write data WD1 which is identical to the write data string WDT. The memory 23 stores the write data string WD1 in an area indicated by the internal address AD1.

2. Second Write Operation and Succeeding Operation

The external access signal RW indicative of the write access and the external address ADR are provided to the address converting circuit 31. The data decomposing circuit 36 holds the write data string WDT to be provided in the buffer 36*a*. The address converting circuit 31 reads, from the memory 23, the data strings RD1 and RD2 corresponding to the external address ADR in the same manner as the read operation. Depending on the presence of the relevant sector, the reference data string RRD which is identical to the data string RD1 or the reference data string RRD obtained by combining the data string RD1 with the data string RD2 is provided from the data combining circuit 35 to the data decomposing circuit 36. The data decomposing circuit 36 compares the write data string WDT held in the buffer 36*a* and the reference data string RRD with each other.

2.1. The Case of No 0-to-1 Changing Data

The address converting circuit 31 converts the external address ADR into the internal address AD1 by referring to the main table 31*a*. The address converting circuit 31 provides the memory 23 with the internal access signal IRW indicative of the write access and the internal address AD1. The data decomposing circuit 36 provides the memory 23 with the write data string WD1 which is equivalent to the write data string WDT. The memory 23 stores the write data string WD1 in an area indicated by the internal address AD1.

2.2. The Case of 0-to-1 Changing Data

The data decomposing circuit 36 outputs the assignment necessity signal RAS. The assignment controller 37 sets the auxiliary table (for example, the auxiliary table 31*c*) and assigns the auxiliary sector 23*c* to the main sector 23*a*. In the main table 31*a*, information indicative of the auxiliary data is set to the sector status information corresponding to the address converting information for converting the external address ADR into the internal address AD1.

The data decomposing circuit 36 generates the write data string WD1 including no 0-to-1 changing data based on the result of the comparison between the write data string WDT and the reference data string RRD. The data decomposing circuit 36 provides the write data string WD1 to the memory 23 and provides the table specifying signal LSW to the address converting circuit 31. The address converting circuit 31 converts the external address ADR into the internal address AD1 by referring to the main table 31*a* based on the table specifying signal LSW, and provides the internal access signal IRW indicative of the write access and the internal address AD1 to the memory 23. The memory 23 stores the write data string WD1 in the area of the main sector 23*a* indicated by the internal address AD1.

Subsequently, the data decomposing circuit 36 generates the write data string WD2 in which the bit of the position of the 0-to-1 changing data is set to have a logical value of 0 and the bit in the other position is set to have a logical value of 1 based on the result of the comparison between the write data string WDT and the reference data string RRD. The data decomposing circuit 36 provides the write data string WD2 to the memory 23 and provides the table specifying signal LSW to the address converting circuit 31. The address converting circuit 31 converts the external address ADR into the internal address AD2 by referring to the auxiliary table 31*c* based on the table specifying signal LSW, and provides the internal access signal IRW indicative of the write access and the internal address AD2 to the memory 23. The memory 23 stores the write data string WD2 in the area of the auxiliary sector 23*c* indicated by the internal address AD2.

[Transfer Operation]

The erasure controller 38 carries out a processing for performing a transfer in response to the write ending signal WCS. For example, the erasure controller 38 provides the assignment change signal CAS to the assignment controller 37. The assignment controller 37 ensures an unused sector (for example, the main sector 23*b*) in response to the assignment change signal CAS. The address converting circuit 31 reads the data strings RD1 and RD2 from the memory 23 in the same manner as in the read operation based on the transfer address ADT output from the erasure controller 38. Depending on the presence of the relevant sector, the transfer data string TRD which is identical to the data string RD1 or the transfer data string TRD obtained by combining the data string RD1 with the data string RD2 is provided from the data combining circuit 35 to the data decomposing circuit 36. The data decomposing circuit 36 provides the memory 23 with the write data string WD which is identical to the transfer data string TRD, and provides the table specifying signal LSW to the address converting circuit 31. The address converting circuit 31 converts the transfer address ADT into the internal address AD1 by referring to the ensured main table 31*b* based on the table specifying signal LSW, and provides the memory 23 with the internal access signal IRW indicative of the write access and the internal address AD1. The memory 23 stores the write data string WD in the area of the main sector 23*b* indicated by the internal address AD1.

When writing a single data string to the main sector 23*b* is ended, the erasure controller 38 provides the incremented transfer address ADT to the address converting circuit 31. Accordingly, the processing is repetitively executed for all of the internal addresses of the main sector 23*a*, and the data strings of the main sector 23*a* and the auxiliary sector 23*c* are transferred to the ensured main sector 23*b*. When the transfer of the data string is ended, the erasure controller 38 provides the assignment change signal CAS to the assignment controller 37 and the assignment controller 37 causes the main sector 23a and the auxiliary sector 23c to be invalid in response to the assignment change signal CAS and sets the ensured main sector 23b into a sector to be a target (validates). Subsequently, the erasure controller 38 provides a sector erasing instruction to the memory 23, and the memory 23 erases the data strings of the main sector 23a and the auxiliary sector 23c.

A writing processing for the control circuit 22 will be described.

Figure 5:
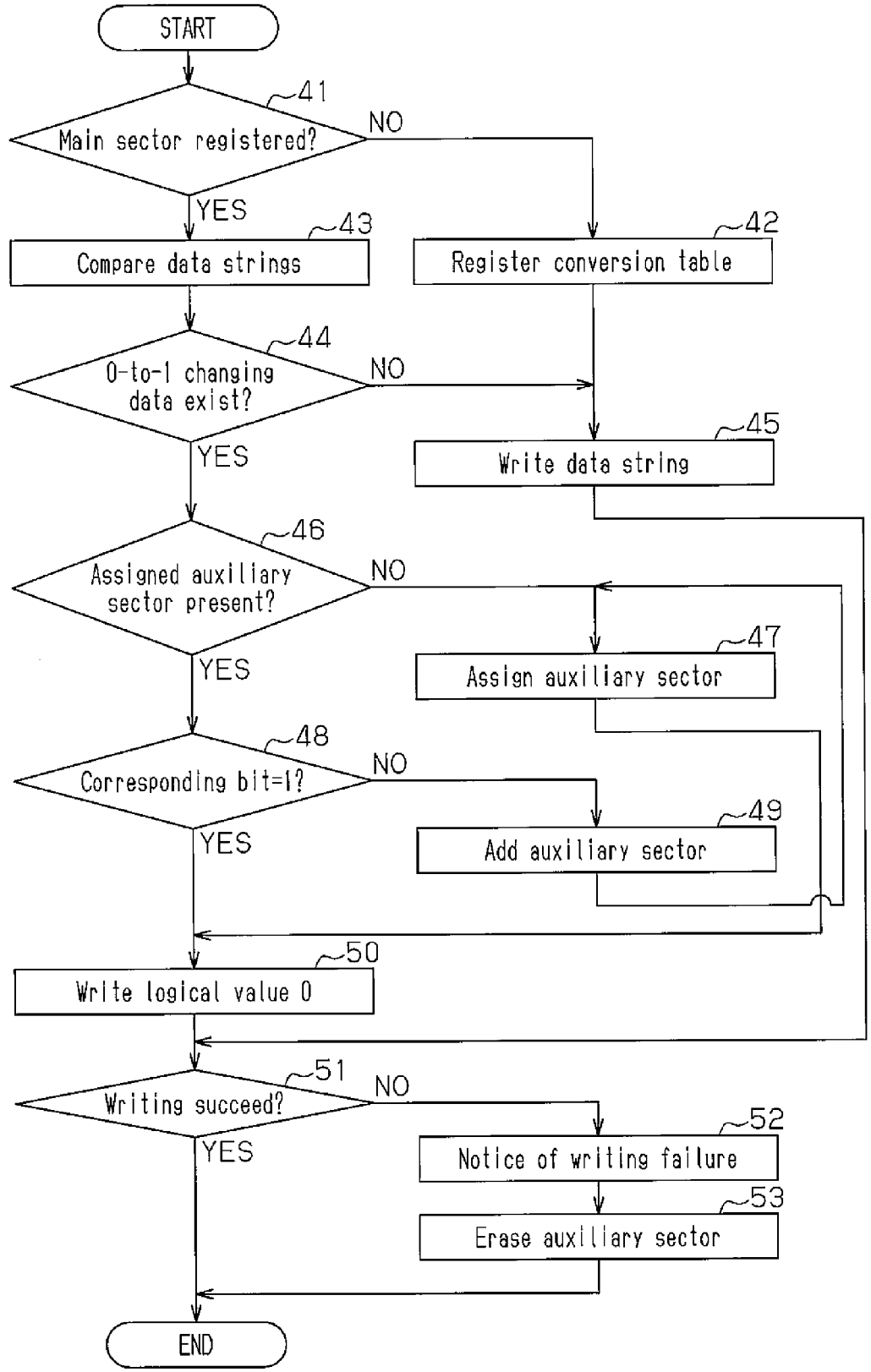
FIG. 5 is a flow chart illustrating a write processing.

As illustrated in FIG. 5, the control circuit 22 determines whether the main sectors 23a and 23b of the memory 23 are registered in the conversion table, for example, whether the address converting information for the external address ADR is registered in the main conversion tables 31a and 31b (step 41). If they are not registered, the control circuit 22 registers the main sector (for example, the sector 23a) to be a target in the conversion table (for example, the main table 31a) (step 42) and the processing proceeds to step 45. On the other hand, if they are registered, the control circuit reads data of a writing destination indicated by the external address ADR (the reference data string RRD) and compares the reference data string RRD with the write data string WDT (step 43).

The control circuit 22 determines whether changing from the logical value of 0 to the logical value of 1 is expected to occur, that is, whether the 0-to-1 changing data is included in the write data string WDT based on the result of the comparison (step 44). If the changing is not expected to occur, the control circuit 22 writes the write data string WDT to the main sector 23a (step 45) and the processing proceeds to step 51.

If the changing is expected to occur, the control circuit 22 determines whether an assigned auxiliary sector is present (step 46). If the auxiliary sector is not present, the control circuit 22 registers one of the auxiliary sectors (for example, the auxiliary sector 23c) in the table (for example, the table 31c) and assigns the auxiliary sector 23c to the main sector 23a in response to the external address ADR (step 47) and the processing proceeds to step 50.

If the auxiliary sector is present, the control circuit 22 determines whether a bit corresponding to the data string indicated by the external address ADR in the auxiliary sector has the logical value of 1 (step 48). The logical value of 1 indicates that a change based on the 0-to-1 changing data is not carried out over the bit and the logical value of 0 indicates that the change based on the 0-to-1 changing data is carried out over the bit. If the relevant data does not have the logical value of 1, that is, has the logical value of 0, accordingly, the control circuit 22 additionally sets a new auxiliary sector (for example, the auxiliary sector 23d) (step 49) and the processing proceeds to the step 47.

If the relevant data has the logical value of 1, the control circuit 22 writes, to the main sector 23a, a data string which does not include the 0-to-1 changing data generated from the write data string WDT and writes the logical value of 0 to the relevant bit of the auxiliary sector 23c (step 50).

Subsequently, the control circuit 22 determines whether the writing succeeds (step 51). If the writing succeeds, the control circuit 22 ends the processing for writing a single data string. If the writing fails, the control circuit 22 provides a signal indicative of a writing failure notice to a source for the write data string WDT (for example, the processor 11 illustrated in FIG. 1) (step 52). Subsequently, the control circuit erases the information corresponding to the external address ADR (the sector status information indicative of the presence of the 0-to-1 changing data in the main table 31a, the address converting information for referring to the auxiliary sector 23c and the like) and erases the auxiliary sector 23c (step 53), and ends the processing for writing a single data string. In the erasure of the auxiliary sector 23c, if the other data are written, the whole sector is erased after the data are saved, and save data are written back to the sector.

A transfer processing of the control circuit 22 will be described in accordance with a flow chart.

Figures 6, 7:
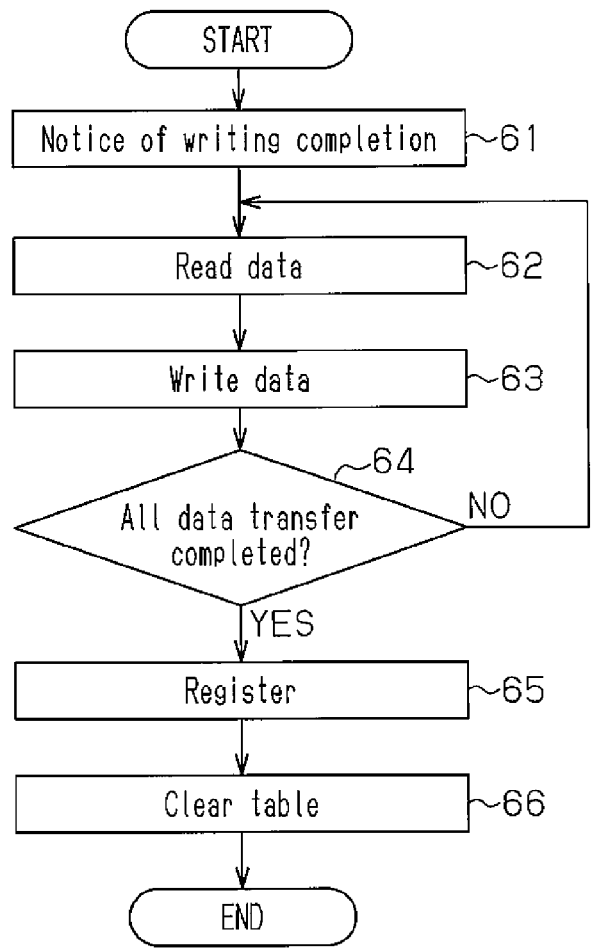

As illustrated in FIG. 6, when receiving a writing completion notice (or detecting a writing completion) (step 61), the control circuit 22 reads a data string of the main sector to be a target (for example, the sector 23a) and a data string of an auxiliary sector (for example, the auxiliary sector 23c) assigned to the main sector (step 62) and writes a data string combined with the main sector (for example, the sector 23b) set for writing (step 63). For example, the control circuit 22 transfers the data strings of the main sector 23a and the auxiliary sector 23c to the main sector 23b.

Subsequently, the control circuit 22 determines whether all of the data are transferred (step 64). If the transfer is not completed for all of the data, the control circuit 22 proceeds to the step 62. For example, the processing of the steps 62 and 63 is repetitively executed to transfer all of the data from the main sector 23a and the auxiliary sector 23c to the main sector 23b.

When the transfer of all of the data are completed, the control circuit 22 registers the address converting information to the main table 31b (step 65) in order to give access to the main sector 23b to be a transfer destination in accordance with the external address ADR. Subsequently, the control circuit 22 clears the tables 31a and 31c corresponding to the main sector 23a and the auxiliary sector 23c which are transfer sources (step 66), and the processing then ends.

Next, an example of the write operation will be described with reference to FIGS. 7 to 11.

The main sector 23a and the auxiliary sector 23c in FIG. 7 are set into an initialized state, respectively. In the main sector 23a in the initialized state, all of memory cells in areas indicated by addresses [000] to [002] have the logical value of 1. In the auxiliary sector 23c in the initialized state, similarly, all of memory cells in areas indicated by addresses [000] to [002] have the logical value of 1. In FIG. 7, the addresses [000] to [002] of the main sector 23a indicate relative addresses in the main sector 23a. Similarly, the addresses [000] to [002] of the auxiliary sector 23c indicate relative addresses in the main sector 23a.

In the case in which a data string "00001111" is written to each of the addresses [000] to [002] of the main sector 23a in the initialized state, the logical value of 1 in memory cells of the main sector 23a is changed to 0 and changing from the logical value of 0 to 1 is not occurred. Accordingly, the data string "00001111" is exactly provided to the main sector 23a. As a result, as illustrated in FIG. 8, the data string "00001111" is stored in each of the addresses of [000] to in the main sector 23a.

Next, it is supposed that "00111100" is written as the data string WDT to the address of [001] of the main sector 23a in FIG. 8. In this case, the data string "00001111" stored in the address [001] of the main sector 23a is read as the reference data string RRD.

As illustrated in FIG. 9, the reference data string RRD and the write data string WDT are compared with each other on a bit unit. In this case, two bits "00" encircled in the reference data string RRD correspond to "11" in the write data string WDT. Two bits "11" encircled in the reference data string RRD correspond to "00" in the write data string WDT. Accordingly, the two bits "11" in the write data string WDT are data for rewriting the data (RRD) in the main sector 23a from the logical value of 0 to the logical value of 1, and therefore, the 0-to-1 changing data.

Accordingly, the control circuit 22 divides the write data string WDT into a data string WD1 including no 0-to-1 changing data (a bit array is "00001100") as illustrated on a left side of FIG. 10 and a data string WD2 having the logical value of 0 in the position of the 0-to-1 changing data (a bit array is "11001111") as illustrated on a right side of FIG. 10.

Figure 11:
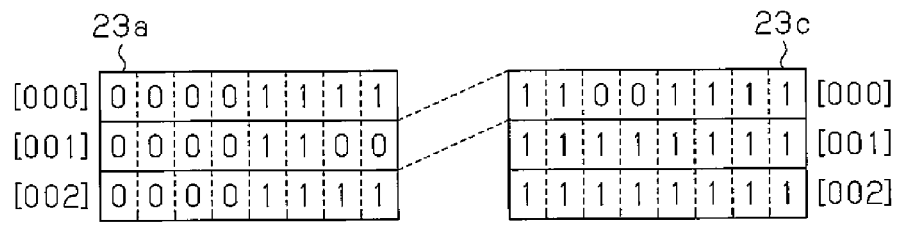

As illustrated in FIG. 11, the control circuit 22 assigns an address "000" of the auxiliary sector 23c to an address [001] of the main sector 23a. The control circuit 22 writes the data string WD1 illustrated in FIG. 10 to the address [001] of the main sector 23a, and writes the data string WD2 illustrated in FIG. 10 to the address [000] of the auxiliary sector 23c.

Figure 12:
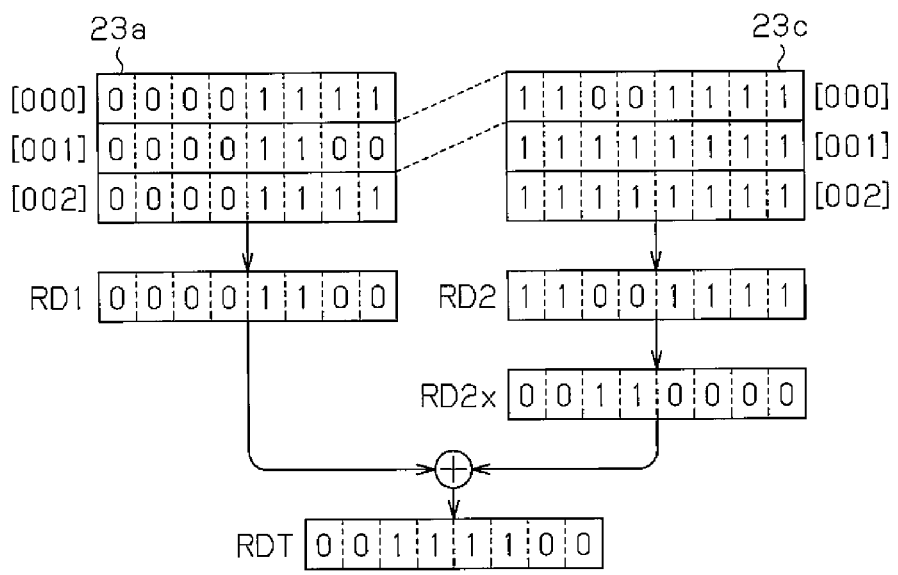
FIG. 12 is a diagram for explaining a read processing.

Next, an example of a read operation will be described with reference to FIG. 12.

As described with reference to FIG. 11, the address "000" of the auxiliary sector 23c is assigned to the address [001] of the main sector 23a in FIG. 12, the data string "00001100" is stored in the address [001] of the main sector 23a, and the data string "11001111" is stored in the address [000] of the auxiliary sector 23c. The control circuit 22 reads the data string of the address [001] of the main sector 23a as a read data string RD1 and reads the data string of the address [000] of the auxiliary sector 23c as an auxiliary data string RD2. The control circuit 22 (the data inverting circuit 34) logically inverts the auxiliary data string RD2 and generates an inverted data string RD2x. The control circuit 22 (the data combining circuit 35) combines (ORs) the read data string RD1 with the inverted data string RD2x to generate the read data string RDT and to output the read data string RDT through the interface circuit 21.

The present embodiment has the advantages described below.

(1) The control circuit 22 determines whether the 0-to-1 changing data that changes the state of the memory from the write state to the erasure state is included in the write data string WDT. If the 0-to-1 changing data is included in the write data string WDT, the control circuit 22 writes the bit in the position other than the 0-to-1 changing data from the write data string WDT to the main sector MSm, and logically inverts the bit in the position to be the 0-to-1 changing data and writes the data thus obtained to the auxiliary sector MSs. The data obtained by logically inverting the 0-to-1 changing data has the logical value of 0. Therefore, the erasure operation is not occurred in the auxiliary sector MSs. Thus, the write data string WDT including the data for changing the logical value of 0 to the logical value of 1 is written to the main sector MSm and the auxiliary sector MSs. As a result, the write data string WDT including the data for changing the logical value of 0 to the logical value of 1 is subjected to the write operation having no erasure operation. This reduces the number of the erasure operations.

(2) The control circuit 22 inverts a logical value placed in a position to be the 0-to-1 changing data and writes the inverted logical value to the auxiliary sector MSs. This processing offers a processing for erasing the data stored in the main sector MSm on a unit of a data string or a bit unit to the outside (for example, the processor 11 illustrated in FIG. 1). Accordingly, the erasure operation is performed on the data string unit or the bit unit.

(3) Writing the write data string WDT including the 0-to-1 changing data through the storage device 13 is not accompanied by the erasure operation. As compared with a time required for carrying out the writing in the memory which is accompanied by the erasure operation, therefore, a time required for writing the storage device 13 is relatively short. This shortens a time required for writing the write data string WDT including the 0-to-1 changing data.

(4) Writing the write data string WDT including the 0-to-1 changing data, that is, the processing for changing from 0 to 1 is not accompanied by the erasure operation. This reduces the number of the erasure operations of the memory 23, and furthermore, prolongs the life of the memory 23.

It should be apparent to those skilled in the art that the present invention may be embodied in many other specific forms without departing from the spirit or scope of the invention. Particularly, it should be understood that the present invention may be embodied in the following forms.

The number of the respective sectors or the size of the sector may be changed properly. For example, the number of the sectors for the external address ADR may be changed appropriately. The numbers of the main sectors and the auxiliary sectors may be changed properly. The numbers of the main sectors and the auxiliary sectors may be set to have different values from each other.

Figure 13A:
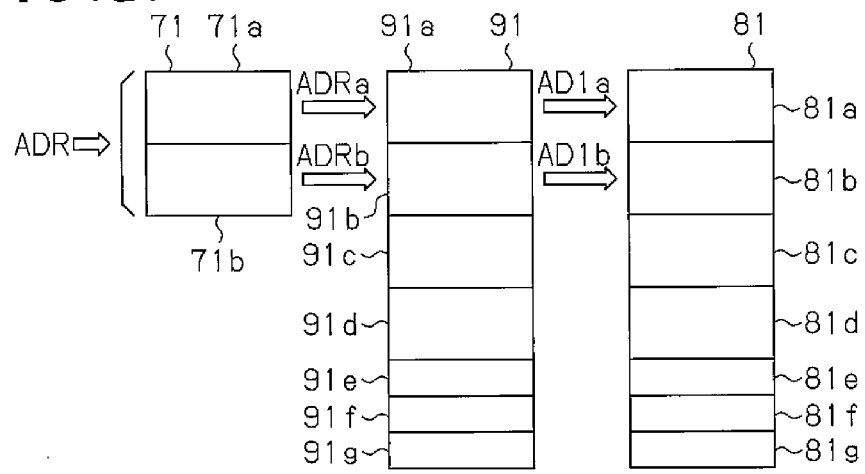
FIGS. 13(a) to 13(c) and FIGS. 14(a) to 14(c) are diagrams for explaining an operation of another storage device.

For example, as illustrated in FIG. 13(a), the external address ADR is a logical address indicative of two logical sectors 71a and 71b. The external address ADR includes a first external address ADRa indicative of the first logical sector 71a and a second external address ADRb indicative of the second logical sector 71b.

A memory 81 includes four main sectors 81a, 81b, 81c and 81d set to have a memory capacity depending on the logical sectors 71a and 71b, and three auxiliary sectors 81e, 81f and 81g set to have a certain memory capacity. The memory capacity of each of the auxiliary sectors 81e to 81g is set to be a half of the memory capacity of the main sectors 81a to 81d, for example.

An address converting circuit 91 includes main tables 91a to 91d corresponding to the main sectors 81a to 81d, and auxiliary tables 91e to 91g corresponding to the auxiliary sectors 81e to 81g.

For example, the main sector 81a is registered in the main table 91a and the main sector 81b is registered in the main table 91b.

Figure 13B:
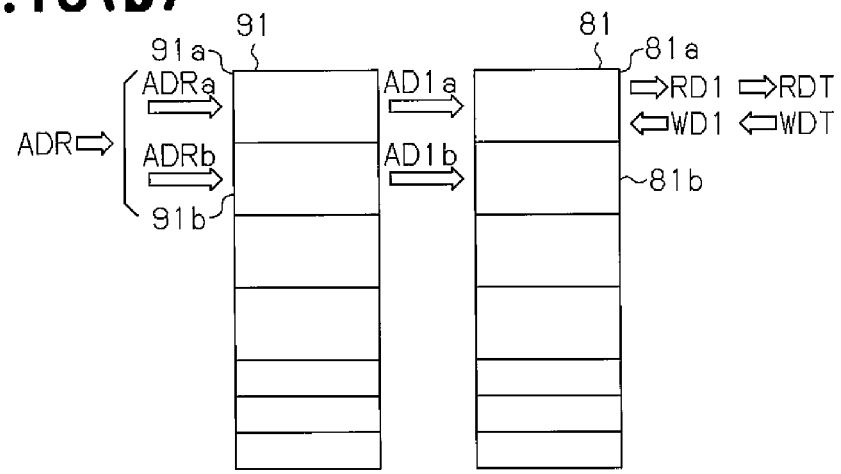

As illustrated in FIG. 13(b), the external address ADRa is converted into an internal address AD1a indicative of the main sector 81a in accordance with address converting information stored in the main table 91a. The memory 81 stores the write data string WDT in the main sector 81a in accordance with the internal address AD1a. The memory 81 reads a data string from the main sector 81a and outputs the read data string RDT in accordance with the internal address AD1.

Similarly, the external address ADRb is converted into an internal address AD1b indicative of the main sector 81b in accordance with address converting information stored in the main table 91b. The memory 81 reads/writes the data string from/to the main sector 81b in accordance with the internal address AD1b.

Figure 13C:
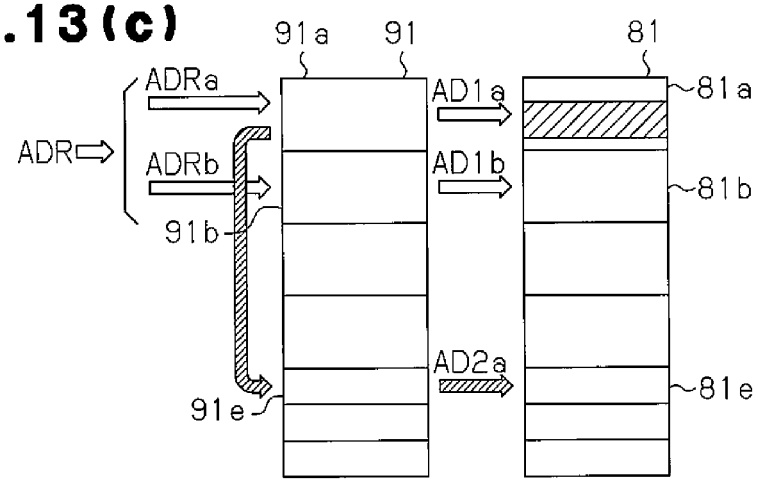

In the case in which the 0-to-1 changing data is included in the write data string to be written to the main sector 81a, the auxiliary sector 81e is assigned to the main sector 81a and the address converting information is registered in the auxiliary table 91e corresponding to the auxiliary sector 81e as illustrated in FIG. 13(c). The auxiliary sector 81e is assigned to a portion that is illustrated with hatching in the main sector 81a. The external address ADRa is converted into the internal address AD1a by the main table 91a and is converted into the internal address AD2a by the auxiliary table 91e. The write data string including the 0-to-1 changing data is divided into a first write data string including no 0-to-1 changing data and a second write data string including data corresponding to the position of the 0-to-1 changing data. The first write data string is written to the main sector 81*a* in accordance with the internal address AD1*a* and the second write data string is written to the auxiliary sector 81*e* in accordance with the internal address AD2*a*.

Figure 14A:
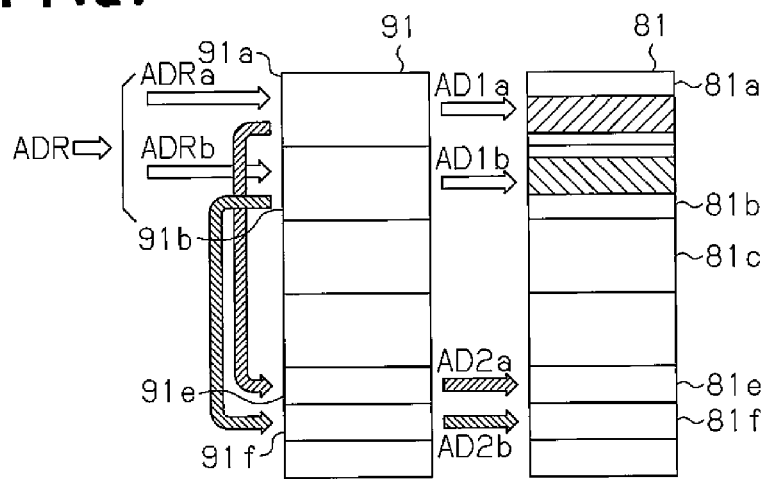
Figure 14B:
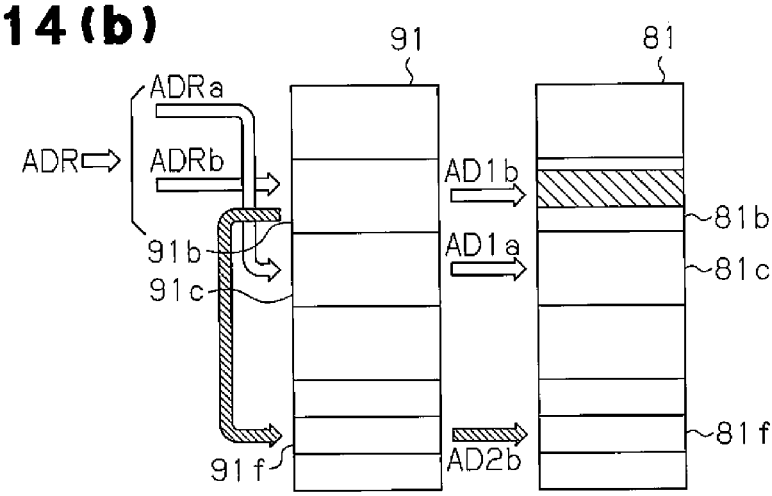
Figure 14C:
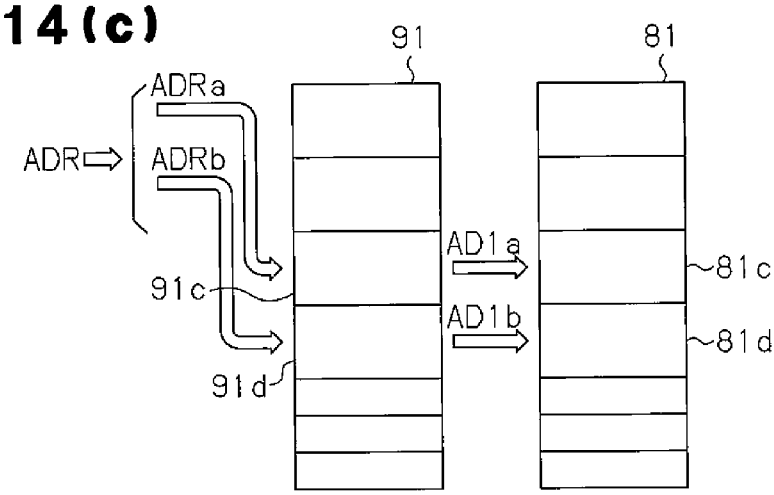

In the case in which the 0-to-1 changing data is included in the write data string to be written to the main sector 81*b*, similarly, the auxiliary sector 81*f* is assigned to the main sector 81*b* and the address converting information is registered in the auxiliary table 91*f* corresponding to the auxiliary sector 81*f* as illustrated in FIG. 14(*a*). The auxiliary sector 81*f* is assigned to the portion illustrated in hatching in the main sector 81*b*. The external address ADRb is converted into the internal address AD1*b* by the main table 91*b* and is converted into the internal address AD2*b* by the auxiliary table 91*f*. The write data string including the 0-to-1 changing data is divided into a first write data string including no 0-to-1 changing data and a second write data string including data corresponding to the position of the 0-to-1 changing data. The first write data string is written to the main sector 81*b* in accordance with the internal address AD1*b* and the second write data string is written to the auxiliary sector 81*f* in accordance with the internal address AD2*b*.

When a writing completion signal or a completion for the main sector 81*a* is detected, the data of the main sector 81*a* and the auxiliary sector 81*e* are transferred to the main sector 81*c*. When the transfer of all of the data is ended, the address converting information is registered in the main table 91*c* corresponding to the main sector 81*c* as illustrated in FIG. 14(*b*). As a result, the external address ADRa is converted into the internal address AD1*a* by the main table 91*c* and the main sector 81*c* is accessed by the internal address AD1*a*.

When a writing completion signal or a completion for the main sector 81*b* is detected, similarly, the data of the main sector 81*b* and the auxiliary sector 81*f* are transferred to the main sector 81*d*. When the transfer of all of the data is ended, the address converting information is registered in the main table 91*d* corresponding to the main sector 81*d* as illustrated in FIG. 14(*c*). As a result, the external address ADRb is converted into the internal address AD1*b* by the main table 91*d* and the main sector 81*d* is accessed by the internal address AD1*b*.

A size (a storage capacity) of the auxiliary sector may be changed properly. For example, in the case in which the number of rewrite operations to the main sector is small, a size (an area) of the memory 23 may be reduced by setting the auxiliary sector to be small.

In the embodiment, the external address ADR is stored as the hit information in the reading list 32. The hit information may be information other than the external address ADR. As the hit information, for example, it is possible to use the internal address A1 obtained by converting the external address ADR by referring to the main tables 31*a* and 31*b*, the internal address AD2 obtained by converting the external address ADR by referring to the auxiliary tables 31*c* and 31*d*, the sector information (for example, the sector address) indicative of the sector (the auxiliary sector) storing the auxiliary data and the like.

Data in a position (a bit) requiring the rewrite may be changed by a bit operation depending on the result of the comparison between the write data string WDT and the reference data string RRD, for example.

The data string RD1 read from the main sectors 23*a* and 23*b* may be supplied to the data combining circuit 35, and the data string RD2 read from the auxiliary sectors 23*c* and 23*d* may be supplied to the data inverting circuit 34 and the data string thus inverted may be supplied to the data combining circuit 35.

A volatile memory (for example, a DRAM) having an equal memory capacity to the memory capacity of the main sector MSm may be provided, the data of the main sector MSm and the data of the auxiliary sector MSs may be transferred to the volatile memory, and the data of the main sector MSm and the auxiliary sector MSs may be erased and the data of the volatile memory may be then written to the main sector MSm.

As the write ending signal WCS, for example, it is possible to use a signal generated when turning OFF the power supply of the electronic device 10, a signal generated when electrically or physically disconnecting the storage device 13 from the bus 12, a reset signal of the electronic device 10, a standby signal for setting the operation of a part of the circuits included in the electronic device 10 into a state such as a stoppage or the like.

The control circuit corresponding to the memory including the auxiliary sectors may control the transfer processing depending on the assignment situation of the auxiliary sector. For example, the control circuit stops accepting a request for writing a new data string and executes the transfer processing in a stage in which a quantity of the auxiliary sector to be assigned in a next write access is equal to or smaller than a certain threshold or is eliminated. In this case, the transfer processing is executed without providing the writing completion signal from outside. This may not increase the processing load of an external circuit (for example, the processor 11 illustrated in FIG. 1).

In the above embodiment, the electronic device 10 is a personal computer. The electronic device 10 may be another device using a flash memory, for example, a recording device, a digital still camera, a digital video camera, a portable telephone, a portable music reproducing device or the like.

Although the storage device 13 is coupled to the bus 12 in the embodiment, the storage device 13 may be incorporated into a storage device to be coupled to an interface circuit or the like, for example, a card type storage device, a storage device to be externally coupled to an electronic device or the like.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of controlling a memory including first and second storage areas which include a plurality of memory cells, the method comprising:

determining, in response to a request for writing a write data string, whether the write data string includes a logical value-changing portion that changes a logical value stored in a memory cell of the plurality of the memory cells from a first logical value to a second logical value which is different from the first logical value;

writing, to the first storage area, a logical value-unchanging portion of the write data string other than the logical value-changing portion of the write data string, wherein the logical value-changing portion of the write data string is not written to the first storage; and inverting a logical value of the logical value-changing portion of the write data string from the second logical value to the first logical value and writing the inverted logical value of the logical value-changing portion of the write data string to the second storage area which is different from the first storage area, wherein the logical value-unchanging portion of the write data string is not written to the second storage area.

2. The method of controlling a memory according to claim 1, further comprising:
reading a first data string from the first storage area in response to a reading request;
reading, from the second storage area, a second data string that is stored in the second storage area and corresponds to the first data string read from the first storage area; and
combining a logical inversion of the second data string with the first data string to generate a read data string and outputting the generated read data string as a response to the reading request.

3. The method of controlling a memory according to claim 1, further comprising:
reading a first data string from the first storage area in response to a reading request;
reading a second data string from the second storage area in response to the reading request; and
combining a logical inversion of the second data string with the first data string to generate a read data string and outputting the generated read data string as a response to the reading request.

4. The method of controlling a memory according to claim 1, wherein the decision includes:
reading, from the memory, an existing data string placed in a writing destination address of the write data string; and
comparing the write data string with the existing data string read from the memory to determine whether the write data string causes changing from the first logical value to the second logical value.

5. The method of controlling a memory according to claim 1, wherein the determining includes:
comparing the data string read from the first storage area with the write data string to determine whether the write data string causes changing from the first logical value to the second logical value if the second storage area does not have the first logical value in an address corresponding to a writing destination address of the write data string;
combining a logical inversion of a data string placed in the address corresponding to the writing destination address in the second storage area with first data string to generate a reference data string if the second storage area has the first logical value in the address; and
comparing the write data string with the reference data string to determine whether the write data string causes changing from the first logical value to the second logical value.

6. The method of controlling a memory according to claim 1, wherein the determining includes
determining, prior to writing the write data string to the first storage area, whether the writing causes changing the first logical value to the second logical value in the first storage area.

7. The method of controlling a memory according to claim 1, wherein the determining includes detecting bits in the writer data string that changes a logical value of 0 in a bit of the first storage area to a logical value of 1.

8. A memory control circuit for use with a memory including first and second storage areas which include a plurality of memory cells, the memory control circuit comprising:
a data decomposing circuit that determines, in response to a request for writing a write data string, whether the write data string includes a logical value-changing portion that changes a logical value stored in a memory cell of the plurality of the memory cells from a first logical value to a second logical value different from the first logical value and decomposes in accordance with a determination result, the write data string into first write data and second write data, the first write data including a logical value-unchanging portion of the write data string, and the second write data configured to write the first logical value in a position in which the changing from the first logical value to the second logical value is expected to occur, the first write data not including the logical value-changing portion of the write data string, the second write data not including the logical value-unchanging portion of the write data string; and
an address converting circuit that converts an external address into a first internal address adapted to write the first write data to the first storage area and converts the external address into a second internal address adapted to write the second write data to the second storage area which is different from the first storage area in response to the writing request.

9. A storage device comprising:
a nonvolatile memory including a first storage area and a second storage area; and
a memory control circuit that controls access to the memory, the memory control circuit including:
a data decomposing circuit that determines, in response to a request for writing a write data string, whether the write data string includes a logical value-changing portion that changes a logical value stored in a memory cell of the plurality of the memory cells from a first logical value to a second logical value different from the first logical value and decomposes in accordance with a determination result, the write data string into first write data and second write data, the first write data including a logical value-unchanging portion of the write data string, and the second write data configured to write the first logical value in a position in which the changing from the first logical value to the second logical value is expected to occur, the first write data not including the logical value-changing portion of the write data string, the second write data not including the logical value-unchanging portion of the write data string; and
an address converting circuit that converts an external address into a first internal address adapted to write the first write data to the first storage area and converts the external address into a second internal address adapted to write the second write data to the second storage area which is different from the first storage area in response to the writing request.

10. An electronic device comprising:
a storage device; and
a processor that writes a data string to the storage device, the storage device includes a nonvolatile memory including first and second storage areas which include a plurality of memory cells, and a memory control circuit that controls access to the memory, wherein the memory control circuit includes:
a data decomposing circuit that determines, in response to a request for writing a write data string, whether the write data string includes a logical value-changing portion that changes a logical value stored in a memory cell of the plurality of the memory cells from a first logical value to a second logical value different from the first logical value and decomposes in accordance with a determination result, the write data string into first write data and second write data, the first write data including a logical value-unchanging portion of the write data string, and the second write data configured to write the first logical value in a position in which the changing from the first logical value to the second logical value is expected to occur, the first write data not including the logical value-changing portion of the write data string, the second write data not including the logical value-unchanging portion of the write data string; and an address converting circuit that converts an external address into a first internal address adapted to write the first write data to the first storage area and converts the external address into a second internal address adapted to write the second write data to the second storage area which is different from the first storage area in response to the writing request.

* * * * *